US012588298B2

(12) United States Patent (10) Patent No.: US 12,588,298 B2
Anker et al. (45) Date of Patent: Mar. 24, 2026

(54) PERC-TANDEM SOLAR CELL WITH SACRIFICIAL LAYER

(71) Applicant: Nederlandse Organisatie voor toegepast-natuurwetenschappelijk Onderzoek TNO, The Hague (NL)

(72) Inventors: John Anker, The Hague (NL); Lambert Johan Geerligs, The Hague (NL)

(73) Assignee: Nederlandse Organisatie voor toegepast-natuurwetenschappelijk Onderzoek TNO, The Hague (NL)

( * ) Notice: Subject to any disclaimer, the term of this patent is extended or adjusted under 35 U.S.C. 154(b) by 32 days.

(21) Appl. No.: 18/263,204

(22) PCT Filed: Feb. 25, 2022

(86) PCT No.: PCT/EP2022/054882
§ 371 (c)(1),
(2) Date: Jul. 27, 2023

(87) PCT Pub. No.: WO2022/180250
PCT Pub. Date: Sep. 1, 2022

(65) Prior Publication Data
US 2024/0030369 A1 Jan. 25, 2024

(30) Foreign Application Priority Data
Feb. 26, 2021 (EP) ..................................... 21159621

(51) Int. Cl.
*H10F 10/172* (2025.01)
*H10F 10/19* (2025.01)
*H10F 71/00* (2025.01)
(52) U.S. Cl.
CPC ........... *H10F 10/172* (2025.01); *H10F 10/19* (2025.01); *H10F 71/129* (2025.01)

(58) Field of Classification Search
CPC ....... H10F 10/172; H10F 10/19; H10F 71/129
See application file for complete search history.

(56) References Cited

U.S. PATENT DOCUMENTS

2009/0017617 A1* 1/2009 Rohatgi ................ H10F 71/121
257/E21.575
2009/0283139 A1* 11/2009 Chen ...................... H10F 10/172
438/57

(Continued)

FOREIGN PATENT DOCUMENTS

EP 3331029 A1 6/2018
WO WO 2020/060487 A1 3/2020

OTHER PUBLICATIONS

Rienacker (Year: 2019).*

(Continued)

*Primary Examiner* — Sadie White
(74) *Attorney, Agent, or Firm* — Ipsilon USA—NLO

(57) ABSTRACT

A method for manufacturing a two terminal or three terminal tandem solar cell with a silicon-based bottom solar cell and a thin-film top solar cell involving: providing a silicon substrate with a front surface and a rear surface, carrying out a sequence of steps including: creating on the front surface a carrier extracting layer stack with at least a carrier extracting layer formed on or in the front surface of the substrate, creating on the rear surface a passivating coating layer with deposition of a first $AlO_x$ layer, creating sacrificial layer stack with a second $AlO_x$ layer on the carrier extracting layer stack on the front surface; creating metal-based electrical contacts on the rear surface, including an annealing step; removing the sacrificial layer stack from the carrier extracting layer stack, and creating the thin film top solar cell on the carrier extracting layer stack.

16 Claims, 4 Drawing Sheets

(56) References Cited

U.S. PATENT DOCUMENTS

2013/0337604 A1* 12/2013 Ozawa ................. H10F 77/219
                                                            252/514
2015/0179837 A1*  6/2015 Cheong ................ H10F 77/937
                                                            136/255

OTHER PUBLICATIONS

Madani, K., Rohatgi, A., Rounsaville, B., Kang, M.G., Song, H.E. and Ok, Y.W., 2020. Enhanced Stability of Exposed PECVD Grown Thin n+ Poly-Si/SiO x Passivating Contacts With Al 2 O 3 Capping Layer During High Temperature Firing. IEEE Journal of Photovoltaics, 11(2), pp. 268-272.

* cited by examiner

PERC-TANDEM SOLAR CELL WITH SACRIFICIAL LAYER

FIELD

The present invention relates to a method of manufacturing a two or three terminal tandem solar cell device with passivated emitter and rear contact (PERC)-based bottom cell.

BACKGROUND

Tandem solar cell devices consist in a stack of a bottom and a top solar cell, connected in series or in parallel. In an attempt to benefit from the main industrial c-Si cell technologies, the bottom cell may be chosen to have a Passivated Emitter and Rear Contact (PERC) structure (Green et al, Solar Energy Materials & Solar Cells 143 (2015), 190-197) or a related Passivated Emitter Rear Totally diffused (PERT) structure. In Peibst et al (IEEE Journal of Photovoltaics, Vol. 9, No. 1, January 2019), a combination of a PERC-bottom cell and thin film top cell is described in which the bottom cell (c-Si-based wafer) is produced with one or more passivating layers on its rear side and an emitter layer on its front side before the emitter is put in contact with the top cell. The emitter layer in Peibst et al. is of a type generally called 'passivating contact', which is typically based on a combination of a thin dielectric (e.g., thin oxide, sometimes called 'tunnel oxide') and a top layer of a suitable work function (e.g., doped polysilicon). In the case of Peibst et al. the emitter is indeed of the type thin oxide/doped polysilicon. Such emitters typically benefit significantly from provision of hydrogen to reduce the recombination defect density at the interface with the c-Si wafer. An effective manner to provide such hydrogen is not included in Peibst et al. Also a technical problem in creating a bottom cell according to Peibst et al is that a thin oxide may be formed or contamination may be deposited on top of the emitter during bottom cell processing, increasing electrical resistance to the top cell.

Therefore, the resulting final tandem device (bottom and top cells connected in series in two-terminal mode, or bottom and top cells connected in three-terminal mode) most likely suffers from enhanced carrier recombination at the interface of the c-Si wafer and the emitter, resulting in a reduction of open-circuit voltage $V_{oc}$, and/or from an increase of series resistance at the emitter-top cell interface reducing fill factor. As a result efficiency of the final tandem device is reduced. Additionally, adding bottom cell process steps for front passivation or for front protection against surface oxides or front surface contamination increases manufacturing times and costs.

It is an object of the present invention to overcome or mitigate one or more of the drawbacks from the prior art.

SUMMARY

To this end, according to a first aspect, the present invention provides a method for manufacturing a two terminal or three terminal tandem solar cell comprising a silicon-based bottom solar cell and a thin-film top solar cell; the top solar cell being arranged on a front surface of the bottom solar cell; the method comprising:

providing a silicon substrate with a front surface and a rear surface, the substrate having a first conductivity type, and carrying out a sequence of steps comprising at least:| creating on the front surface a carrier extracting layer stack, the carrier extracting layer stack comprising at least a carrier extracting layer formed on or in the front surface of the substrate, creating on the rear surface a passivating coating layer comprising at least a deposition of a first $AlO_x$ layer, wherein the method further comprises:

creating sacrificial layer stack comprising at least a second $AlO_x$ layer on the carrier extracting layer stack on the front surface;

removing the sacrificial layer stack from the carrier extracting layer stack on the front surface, and creating one or more layers of the thin film top solar cell on the carrier extracting layer stack.

The second layer $AlO_x$ serves as a sacrificial layer sustaining hydrogenation and passivation of the emitter layer which subsequently benefits by reduction of carrier recombination at the interface of the emitter layer with the top cell. Creation of rear electrical contacts implies the second $AlO_x$ is subject to a thermal annealing promoting hydrogenation. Furthermore the creation of a second $AlO_x$ layer together with deposition of an $AlO_x$ layer at the rear surface of the substrate allows to simplify manufacturing; the two layers may be deposited within a single all-sided deposition process, reducing manufacturing time, material requirements and costs. The second $AlO_x$ layer further protects the front surface of the emitter during creation of electrical contacts of the rear surface.

In an embodiment, the method comprises a forming step of a layer for creating metal-based electrical contacts on the rear surface, including an annealing step to create the electrical contacts, which forming step is conducted after creating and before removing the sacrificial layer stack; and wherein after removing the sacrificial layer, the thin-film solar cell is created onto the carrier extracting layer stack.

In an alternative embodiment the method comprises creating on the rear surface a contact pattern and after at least the step of removing the sacrificial layer, performing an annealing step for creating electrical contacts from the contact pattern.

In an embodiment, the second $AlO_x$ layer is removed from the emitter layer on the front surface by means of a single-sided etching process. A single-sided etching process for removal of the second $AlO_x$ layer provides fast and secure removal of the layer with sole removal of the $AlO_x$ leaving a substantially clean, preferably bare emitter surface. The etching provides a substantially complete removal of the second $AlO_x$ layer from the front surface.

In an embodiment, the passivating coating layer on the rear surface comprises a stack of the $AlO_x$ layer and a silicon nitride layer, in which the $AlO_x$ layer is arranged between the silicon substrate and the silicon nitride layer, and the creation of the rear passivating coating layer comprises a single-sided deposition of the at least one silicon nitride layer. Deposition of the rear $AlO_x$ and silicon nitride stack allows enhanced passivation of the rear silicon substrate, while keeping the number of different deposition steps reduced, the $AlO_x$ being also deposited at the same time at the front as a second layer: the silicon nitride is deposited in one single-step following the $AlO_x$ deposition on front of the emitter together with on rear on the silicon substrate.

In an embodiment, the creation of the emitter layer is preceded by a deposition or formation of a thin dielectric layer on the front surface, in which the thin dielectric layer is arranged between the front surface of the silicon substrate and the emitter layer. The thin dielectric layer provides passivation to the silicon substrate, whether it is deposited (i.e., deposition as an extra step of a dielectric layer) or formed (i.e., the Si substrate is processed, e.g., by oxidation of its front surface, so as to have a dielectric layer on the front surface).

In an embodiment, the thin dielectric layer is selected from a group comprising a tunnel oxide layer, a silicon-oxy-nitride, $SiO_xN_y$, layer and an aluminium oxide, $Al_2O_3$, layer. A thin dielectric layer as such will promote one of tunneling, pinhole transport and/or thermal activation that are beneficial to the bottom cell junction.

In an embodiment, the emitter layer comprises a material selected from a group comprising poly-silicon, aluminium-zinc-oxide, poly-silicon containing carbon impurities, poly-silicon containing oxygen impurities. Such materials provide an emitter layer of a second conductivity type while providing passivation together with the dielectric layer.

In an embodiment, the emitter layer is a poly-silicon layer comprising a p/n junction (arranged inside the poly-silicon layer). The emitter layer comprising an intrinsic p/n junction allows to enhance the number of diffusing carriers and increase charge carrier collection in the tandem device.

In an embodiment, the emitter layer comprises aluminium-zinc-oxide and the method further comprises the creation of an n-type diffusion layer in the front surface of the silicon substrate preceding the formation of the thin dielectric layer. An additional diffusion layer provides enhanced carrier diffusion at the device terminals.

In an embodiment the thin film top solar cell is selected from a group comprising a perovskite(s) based thin solar cell, a copper indium gallium diselenide (CIGS) based solar cell, an amorphous silicon based (a-Si) solar cell and a cadmium telluride (CdTe) based solar cell. Top cells as such with relatively larger bandgaps in comparison with the bandgap of the Si-based bottom cell provide adequate materials for completion into a tandem device.

According to a further aspect, the invention relates to a two terminal or three terminal tandem solar cell comprising a silicon based bottom solar cell and a thin-film top solar cell in which the top solar cell is arranged on a front surface of the bottom solar cell, wherein the tandem solar cell is manufactured according to any of the above cited embodiments. The two or three-terminal tandem solar cell provides all the advantages cited above.

Advantageous embodiments are further defined by the dependent claims.

BRIEF DESCRIPTION OF DRAWINGS

The present invention will be discussed in more detail below, with reference to the attached drawings, in which.

The solar cells and features thereof are shown schematically and are not drawn to scale.

DETAILED DESCRIPTION OF EMBODIMENTS

Although the tandem solar cell is presented in the embodiments of the invention below as a two terminal solar cell device, a three terminal tandem solar cell device may also be embodied in accordance with the invention. Furthermore, some layer deposition and formation methods are cited in the embodiments, but the skilled person in the art may consider alternative methods providing same or similar results. The flowcharts below are presented in accordance with a sequence of steps for the manufacture of the solar cells.

Figure 1:
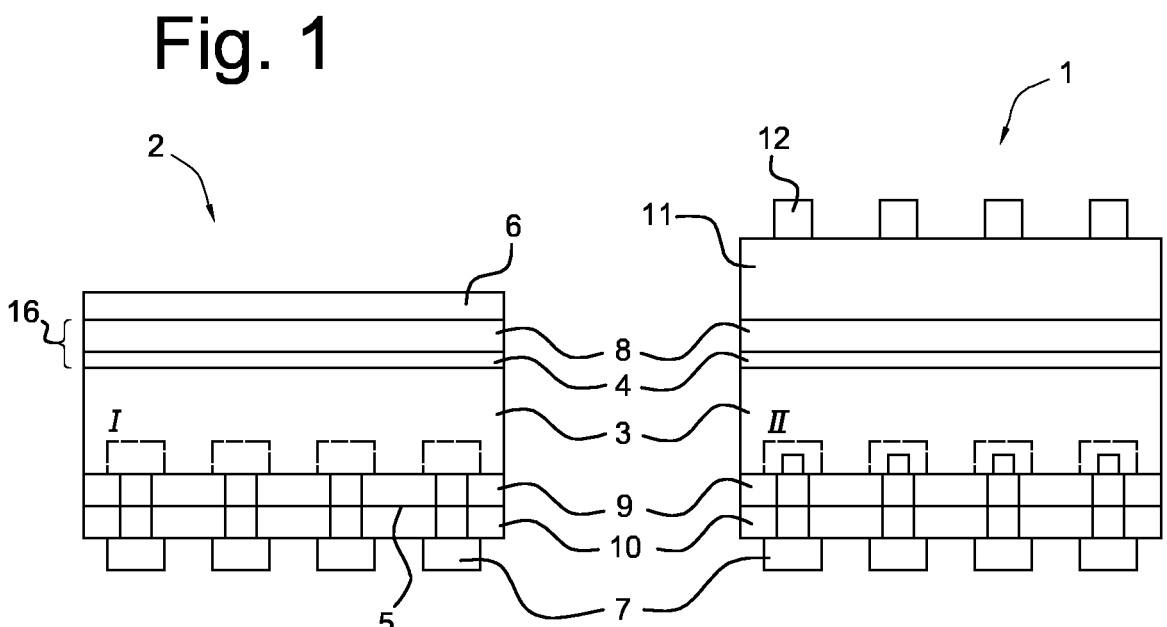
FIG. 1 shows a cross-sectional view of a PERC bottom cell and corresponding completed tandem solar cell device in accordance with the present invention.

FIG. 1 shows a cross-sectional view of a PERC bottom cell 2 (shown on the left) in accordance with an embodiment of the present invention for completion into a tandem solar cell device 1. A cross-sectional view of the completed tandem solar cell device 1 is shown on the right. The PERC bottom cell 2 comprises a substrate 3, a front carrier extracting layer stack 16, a rear passivating stack 5 and a sacrificial layer 6. The bottom cell 2 further comprises rear contacts 7. The front carrier extracting layer stack 16 is composed of a thin dielectric layer 4 and a carrier extracting layer 8.

The substrate 3 of the bottom cell 2 has a front surface and a rear surface, in which the front surface is the side on which the main amount of radiation is incident during use of the tandem solar cell 1. The substrate 3 is a silicon-based substrate of a first conductivity type. The carrier extracting layer 8 is typically of a second conductivity type, and is arranged on the front surface of the substrate 3, where the thin dielectric layer 4 is arranged between the substrate and the carrier extracting layer 8. The first conductivity type is one of p-type doping or n-type doping, typically p-type. In this embodiment, the second conductivity type is also one of p-type doping and n-type doping but typically opposite to the first conductivity type, and thus in this case n-type. In this way a p-n junction is formed by the junction of the substrate and the front carrier extracting layer stack 16. The carrier extracting layer 8, when n-type (electron-selective) is selected from a group comprising a n-type polycrystalline silicon (polysilicon) layer, an aluminium-doped zinc oxide (AZO)-layer, a titanium oxide layer, and other materials capable to form an electron-selective passivating contact in combination with the thin dielectric layer 4. Also, the carrier extracting layer can be a silicon-based layer being amorphous, partially crystalline or polycrystalline, mainly consisting of silicon. Such an amorphous layer can during a subsequent anneal later in the processing be transformed into a partially crystalline or polycrystalline layer. Alternatively to a carrier extracting layer being a polysilicon layer of a single conductivity type, the carrier extracting layer is part of a p-n junction polysilicon layer stack. In the case of the p-n junction polysilicon layer stack the front carrier extracting layer stack 16 thus further comprises an additional layer of an opposite conductivity type, on top of (at the light-incident side of) the first layer of polysilicon 8. In addition, the additional layer of an opposite conductivity type can be a silicon-based layer being amorphous, partially crystalline or polycrystalline, mainly consisting of silicon. Such an amorphous layer can during a subsequent anneal later in the processing be transformed into a partially crystalline or polycrystalline layer. Further variations of a polysilicon-based carrier extracting layer and layer stack include, but are not limited to, polysilicon containing oxygen impurities and/or polysilicon containing carbon impurities. See e.g., Josua Stuckelberger et al., "Passivating electron contact based on highly crystalline nanostructured silicon oxide layers for silicon solar cells", Solar Energy Materials and Solar Cells, Volume 158, Part 1, 2016, Pages 2-10, SSN 0927-0248, and e.g., J. Steffens et al., "Influence of the Carbon Concentration on (p) Poly-SiCx Layer Properties With Focus on Parasitic Absorption in Front Side Poly-SiCx/SiOx Passivating Contacts of Solar Cells," in IEEE Journal of Photovoltaics, vol. 10, no. 6, pp. 1624-1631, November 2020.

Further variations of the layer stack 16 may comprise an additional layer that extracts opposite type carriers from the top cell absorber layer, for example a nickel oxide or molybdenum oxide or tungsten oxide layer for hole extraction from the top cell absorber layer, on top of the n-type polysilicon layer or aluminium-doped zinc oxide or titanium oxide layer that extracts electrons from the bottom cell. For an efficient recombination junction between these layers, an intermediate layer like ultra-thin (e.g., one or a few nanometres thick) metal, or a thin (e.g., between 5 and 30 nanometres) layer of transparent conductive oxide (e.g., indium tin oxide), may also be included.

The thin dielectric layer 4 interposed between the substrate 3 and the carrier extracting layer 8 provides charge transport between the carrier extracting layer and the substrate based on at least one of tunnelling, pinhole transport, thermal activation. The thin dielectric layer 4 may be one of but is not limited to: a silicon oxide layer, a layer comprising $SiO_xN_y$ (silicon-oxy-nitride), a layer comprising aluminium oxide $Al_2O_3$ and an intrinsic amorphous silicon (a-Si) layer. The thin dielectric layer also acts as a buffer layer in that it passivates the substrate 3 surface. As an effect, interface charge recombination may be reduced. In some embodiments the thin dielectric layer 4 may be absent.

The rear passivating stack 5 is arranged on the rear surface of the substrate 3 and comprises at least a rear $AlO_x$ layer 9, when alone forming a rear passivating coating layer of $AlO_x$, preferably a stack of rear $AlO_x$ 9, $SiN_x$ 10 layers, with the rear $AlO_x$ 9 in direct contact with the substrate 3, forming the rear passivating stack.

The subscript x, y in the Al-based or Si-based compounds indicates that the composition of the layer compound may deviate from the respective stoichiometric compound. For example, the composition of the $AlO_x$ layer may deviate from the stoichiometric compound $Al_2O_3$.

Rear contacts 7 are usually aluminium or aluminium-based contacts and in direct contact with the most outer layer of the rear passivating stack 5, which can be the rear $AlO_x$ layer 9, most preferably the $SiN_x$ layer 10. Openings are provided in the rear passivating stack for the rear contacts to be locally in direct contact with the substrate surface. During anneal of the rear contacts the aluminium alloys with the rear substrate surface (process labelled I) and after cool-down locally highly Al-doped silicon regions have formed around the Al-silicon contact (labelled II). This is a common industrial method of providing rear side contacts to p-type PERC cells.

The sacrificial layer 6, or second $AlO_x$ layer is arranged on the carrier extracting layer 8. If the layer stack 16 comprises an additional layer on top, as described above, the sacrificial layer 6 would be arranged on top of that additional layer. It is called sacrificial because it is temporarily present on the bottom cell (left) 2 and is removed before completion into the final tandem device 1 (right) by creating a top thin-film cell 11. The sacrificial layer is an $AlO_x$ layer and has a thickness between about 3 and about 50 nm. During the deposition process of layer 6, hydrogen is incorporated in the layer 6, originating from the precursor molecules used in the deposition process. Already during the deposition this hydrogen may have a beneficial effect on the passivation of the layer stack 16 on the substrate. The passivation of layer stack 16 may be improved by a post-deposition anneal at a temperature not exceeding 600° C. The passivation by the layer stack 16 when capped by a very thin layer of $AlO_x$ may not be stable against the firing process of the rear contacts, which typically reaches a peak temperature around 800° C. degrees C., due to dehydrogenation occurring at such a temperature. To enhance hydrogenation and passivation of the layer stack 16 during such a later rear contact firing process, the sacrificial layer may be made substantially thicker than the layer 9 (which is usually not thicker than 20 nm), e.g., between 20 and 50 nm. Also, to improve stability of the passivation of layer stack 16 under such a later rear contact firing process, layer 6 may be embodied as a stack with a thin layer of additional dielectric (e.g. $SiO_x$, or silicon-oxy-nitride) on top of the $AlO_x$ layer, where this possible additional dielectric layer is sufficiently thin not to limit the removal of the sacrificial layer in a later HF etching step. A thickness of the bottom cell without sacrificial layer (rear passivating stack, substrate, dielectric layer, carrier extracting layer) may be in the order of 100-200 microns. The substrate 3 may comprise a textured surface (as a typical example a so-called random pyramid texture), on front and/or rear surface. The height of the texture features may be as large as several microns, but may be reduced on the front to 1 micron or less to enable complete coverage with the absorber layer of the top cell (part of layer stack 11) if that absorber layer is deposited non-conformally and thinner than a few microns, for example less than 3 microns.

The tandem solar cell device 1 comprises the bottom cell 2, without the sacrificial layer $AlO_x$ and covered at the front side by the top thin film cell 11 and front contacts 12. The front contacts are for example silver or silver-based contacts.

The top thin-film cell 11 may be one selected from, but not limited to, a group comprising a perovskite (especially the widely used Pb or Sn halide based), chalcogenides such as copper indium gallium diselenide (CIGS), copper zinc tin sulfide (CZTS), cadmium telluride (CdTe), and amorphous silicon (a-Si)-based thin film solar cell, as long as its bandgap is superior (relatively larger) to the bandgap of the Si-based bottom cell.

The top cell 11 may further comprise bottom layer(s) (not shown) such as but not limited to, a recombination layer such as a thin transparent conductive oxide like indium tin oxide (ITO), indium tungsten oxide (IWO), an ultra-thin metallic layer, and/or a hole transport layer or layer stack like nickel oxide (NiO), tungsten oxide ($WO_3$), and polytriarylamine (PTAA), etc.

Optionally, in this embodiment a doped layer is arranged on the front surface of the substrate, between the substrate 3 and the carrier extracting layer stack 16. The dopant type of the doped layer is the same as the carrier type extracted by the layer stack 16. For example, a phosphorus diffused silicon layer may be arranged in the front surface of the substrate covered by a silicon oxide/n-type polysilicon stack. The presence of such a doped layer may enhance the performance of the bottom cell.

Figure 2:
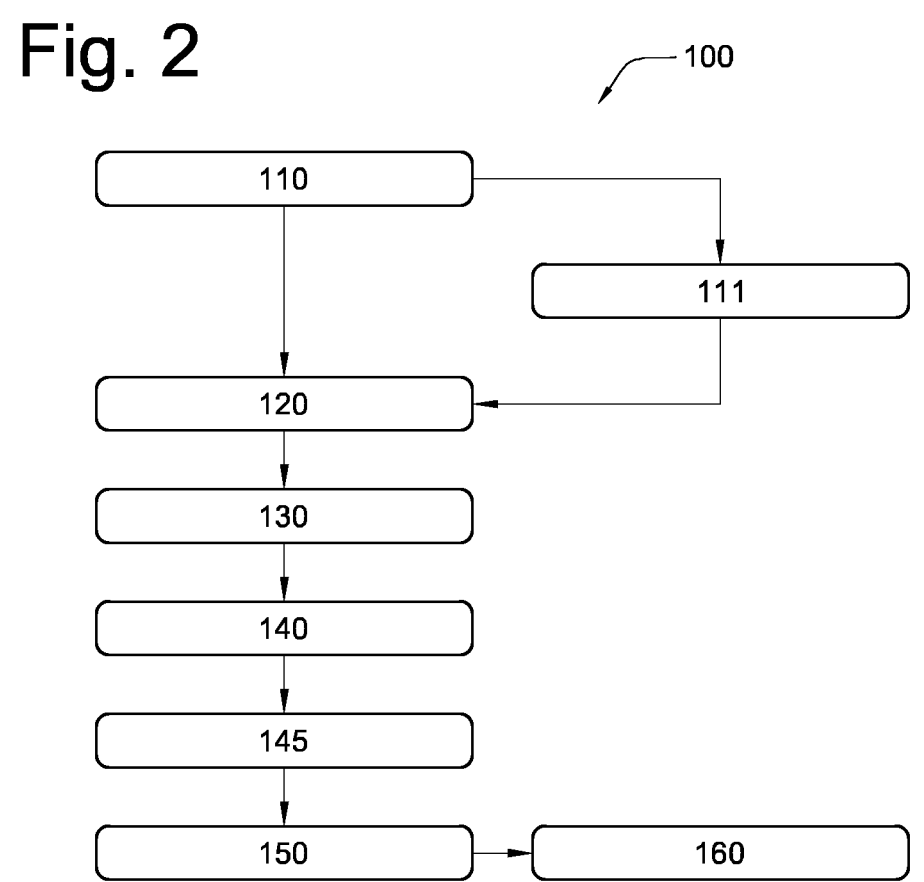
FIG. 2 shows a flowchart of a method of manufacturing of the tandem solar cell device with PERC bottom cell of FIG. 1 in accordance with the present invention.

FIG. 2 shows a flowchart 100 of a method of manufacturing of the bottom cell 2 and tandem solar cell 1 in accordance with the embodiment of FIG. 1 of the present invention. In the flowchart the method is presented by a number of steps that are carried out in a sequence. Other optional steps may be carried out intermediately.

In step 110, the front carrier extracting layer stack 16 is created on the front surface of the substrate 3 by methods known in the state-of-the-art of which the thin dielectric layer 4 can be created by a variety of means, such as thermal oxidation, chemical oxidation, a deposition process (plasma enhanced chemical vapour deposition (PECVD), atomic layer deposition (ALD), etc.). A carrier extracting layer 8 can be deposited by e.g., in particular for a polysilicon layer or layer stack a low pressure chemical vapour deposition (LPCVD) or PECVD followed by anneal, and in particular for a metal oxide layer 8 by e.g., ALD or PECVD or physical vapour deposition (PVD) or pulsed laser deposition (PLD). In other embodiments the thin dielectric layer will not be deposited and hence the emitter layer will be directly deposited into the substrate. The substrate may be cleaned prior to the deposition(s).

In step 120 both the rear $AlO_x$ layer 9 of the rear passivating stack 5 and the front $AlO_x$ sacrificial layer, or second $AlO_x$ layer 6 are deposited onto the rear surface of the substrate 3 and front surface of the carrier extracting layer 8, respectively, advantageously in the same process of ALD or PECVD. Depositions of the rear $AlO_x$ layer 9 and the sacrificial layer 6 may also be done consecutively, and/or with different deposition technologies. As part of the $AlO_x$ layer deposition, a very thin interfacial oxide (e.g., 1-3 nm) may form between the front surface of the carrier extracting layer 3 and the $AlO_x$ sacrificial layer 6 and/or between the rear surface of the substrate and the rear $AlO_x$ layer 9 inherently due to the oxidising precursor in the ALD process or intentionally due to a dedicated pre-oxidation step, e.g., wet chemical or PECVD. After the deposition, a post anneal may be performed, for example at a temperature between 300 and 500° C. On top of the sacrificial $AlO_x$ layer, an additional sacrificial thin dielectric layer may be deposited as described above, before or after the post-anneal, e.g. by PECVD.

In optional step 111 any parasitic deposition of the front carrier extracting layer stack 16 on the rear surface of the substrate 3 is cleaned prior to deposition of the rear $AlO_x$ layer 9. Cleaning is performed via methods including etching, rinsing and drying, typically by a so-called single-side-etch ((SSE), a wet-chemical process).

In step 130 the rear $SiN_x$ layer 10 of the rear passivating stack 5 is deposited onto the rear $AlO_x$ layer 9. For better performance in step 150, the $SiN_x$ layer may be varied, e.g., thickness adjusted, or a thin capping layer of $SiO_x$ may be added to modify wetting properties in step 150. Subsequently, contact openings are created in the rear $AlO_x/SiN_x$ stack, for example by a laser ablation process.

In step 140 rear contacts 7 are deposited onto the rear surface, whose surface coverage includes the contact openings. Contact deposition is typically done by screen printing of thick film metallization paste, although other deposition methods like sputtering, e-beam, or thermal evaporation can also be used.

An annealing step 145 is carried out after step 140 for formation of a low resistance contact of contacts 7 to the substrate. Typically, the anneal temperature peak will be higher than the eutectic temperature of aluminium and silicon mixed phase (577° C.), or the melting temperature of aluminium (670° C.), which would be sufficient to form an intimate Al—Si contact with so-called back surface field (BSF) (locally highly Al-doped silicon regions) around the aluminium-silicon contact after cool down (BSF indicated by dashed boxes in FIG. 1, right). The annealing step may also promote the hydrogenation of the carrier extracting layer 8 and thin dielectric layer 4. In return, surface passivation is improved. The temperature peak of the anneal may be limited in order to avoid dehydrogenation of layer stack 16, e.g. to not more than 750° C., though this may reduce the thickness and performance of the BSF.

In step 150 the sacrificial $AlO_x$ layer 6 is removed so as to leave an exposed surface of the carrier extracting layer (or in general, the exposed surface of the layer stack 16, which may have additional top layers as described above), preferably a bare surface free of $AlO_x$ traces. The removal of the sacrificial layer consists in preferably a single-sided etch (SSE), the single side being the front side of the bottom cell where the sacrificial layer lies, selectively with respect to carrier extracting layer 8. The etching provides a substantially complete removal of the sacrificial layer. If the carrier extracting layer 8 consists of polysilicon or a polysilicon alloy, it is most preferably a single-sided hydrofluoric acid (HF) etch. If the removal etch is not, or not perfectly, single sided, the $SiN_x$ layer 10 of the rear passivating coating 5 of a thickness of approx. 50-100 nm acts as a protective layer to the rear side of the bottom cell during etching, and its thickness could be increased to compensate for thickness reduction during etching. If a so-called water cap is applied to the rear side during this SSE to protect the rear side from etching, a capping layer on the rear side of e.g., $SiO_x$ can enhance wetting and improve protection, as described earlier. If the carrier extracting layer 8 is different from polysilicon or polysilicon alloy, other suitable selective etchants for the $AlO_x$ layer 6 can be selected that leave the layer 8 largely unaffected.

In step 160 the top thin-film solar cell 11 is deposited onto the exposed and preferably bare surface of layer stack 16; front contacts 12 are deposited onto the top cell to complete the device. The front contact deposition method can make use of screen-printing, and/or further methods known to the skilled person in the art.

Figure 3:
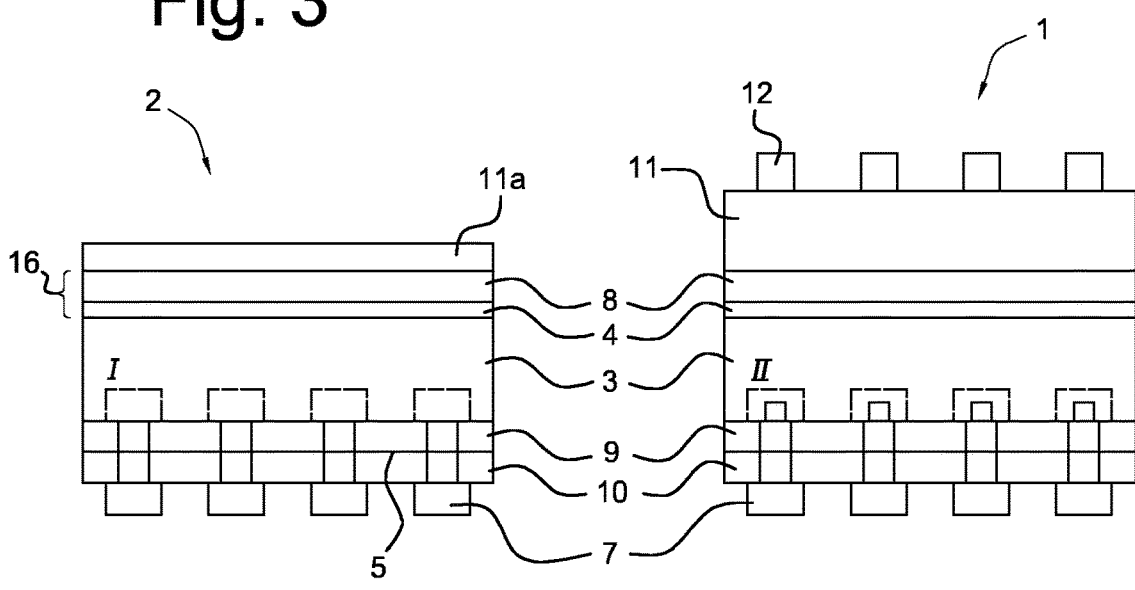
FIG. 3 shows a cross-sectional view of a PERC bottom cell in accordance with an embodiment of the present invention.

FIG. 3 shows a cross-sectional view of a PERC bottom cell in accordance with an embodiment of the present invention.

Figure 4:
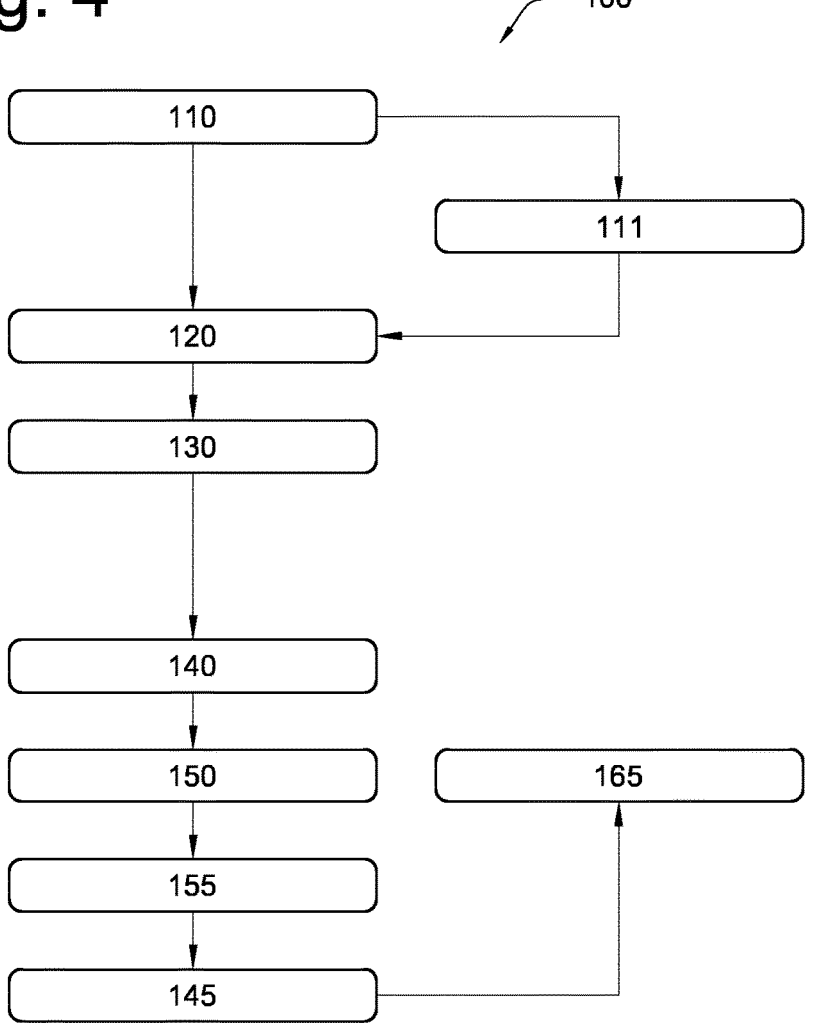
FIG. 4 shows a flowchart of a method of manufacturing of the tandem solar cell device with PERC bottom cell of FIG. 3 in accordance with the present invention.

In this embodiment, an alternative order of process steps is performed. Similar as in the previous embodiment the process steps 110, 120, 130 and optionally 140 are carried out in which step 110 relates to creating the front carrier extracting layer, the step 120 relates to forming the rear $AlO_x$ layer 9 and the front $AlO_x$ sacrificial layer 6, the step 130 relates to depositing the rear $SiN_x$ layer 10. and the step 140 relates to the deposition of the rear layer from which the rear contacts 7 will be formed. Then, preceding the annealing step 145 to form the rear contacts (and optionally also preceding the deposition step 140), the sacrificial $AlO_x$ layer 6 is removed from the front surface of the bottom cell stack and one or more layers 11a of the top cell stack (for example a TCO layer and/or a hole transport layer comprising NiO or $WO_3$) are deposited on the front surface of the bottom cell stack. In this manner, hydrogenation of the front surface of the bottom cell stack is caused by the (temporary) $AlO_x$ sacrificial layer 6 while the one or more layers 11a of the top cell stack function as sealing layer to prevent out-diffusion of hydrogen from the front surface of the bottom cell stack during the annealing step that creates the rear contacts 7. FIG. 4 shows a flowchart of a method of manufacturing of the tandem solar cell device with PERC bottom cell of FIG. 3 in accordance with the present invention.

Accordingly to the embodiment the process is similar to the process shown in FIG. 1 following the steps 110, 120, 130 and 140 as described above. After step 140 however, the removal step 150 to remove the $AlO_x$ sacrificial layer 6 is carried out. Subsequently, a process step 155 is carried out to form the one or more layers 11a of the top cell stack on the front surface of the bottom cell stack.

After step 155, the annealing step 145 is carried out to form the rear contacts 7 (and step 140 is carried out if not yet carried out before step 150). Finally after step 145, additional step 165 is carried out to create one or more layers to create/complete the top cell stack 11.

Figure 5:
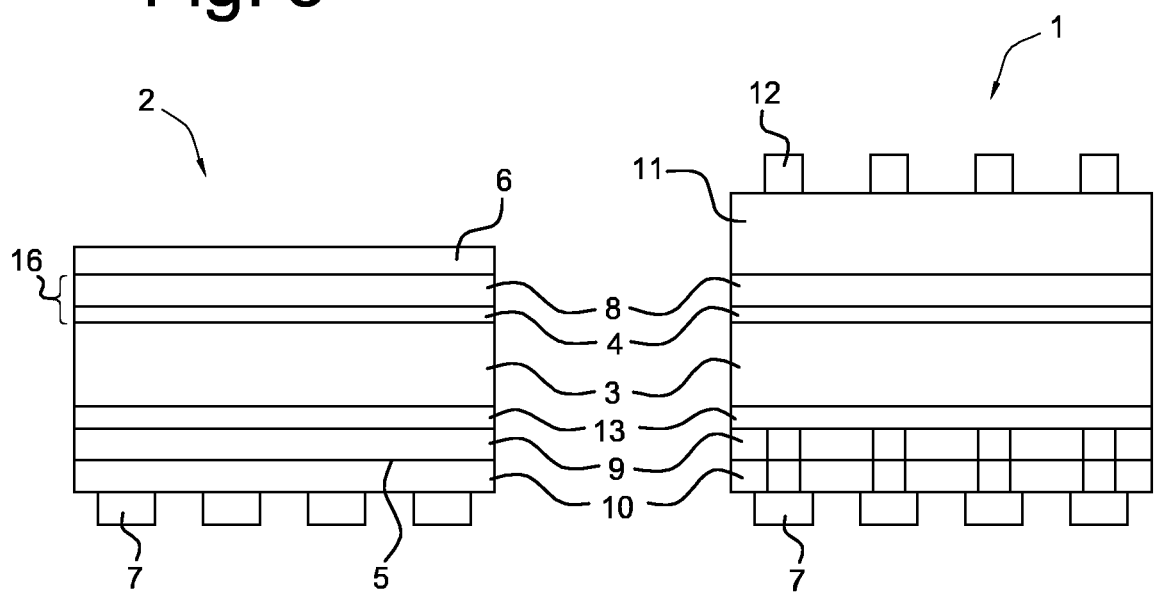
FIG. 5 shows a cross-sectional view of a PERT bottom cell and corresponding completed tandem solar cell device in accordance with the present invention.

FIG. 5 shows a cross-sectional view (left) of a commonly so-called PERT bottom cell 2 according to an embodiment of the present invention for completion into the tandem solar cell device 1 (right). The bottom cell here also comprises the silicon-based substrate 3, the carrier extracting layer 8, the rear passivating rear stack 5, the sacrificial $AlO_x$ layer 6, the rear contacts 7 and the thin dielectric layer 4, similarly to the embodiment of FIG. 1. In other embodiments the thin dielectric layer may be absent. The possibility for variations with additional top layers on layer 8, as described for the embodiment of FIG. 1, also applies here.

Further in this embodiment typically the first conductivity type of the substrate 3 and the second conductivity type of the carrier extracting layer 4 are identical and both n-type doping. The carrier extracting layer 8 is a polysilicon layer or is one of variations such as described for the embodiments of FIGS. 1-4. The thin dielectric layer 4 is interposed between the substrate 3 and the carrier extracting layer 8. In some embodiments the thin dielectric layer 4 may be absent.

Sometimes, in literature, the front carrier extracting layer stack 16 is called a 'front surface field' layer stack rather than front carrier extracting layer stack, because it has the same polarity as the substrate 3. Other times, the front carrier extracting layer stack 16 is called a 'front emitter layer stack' but 'emitter' most often relates to a carrier extracting layer of the conductivity type opposite to the conductivity type of the substrate. Also common in literature is to name the stack of thin dielectric 4 and carrier extracting layer 8 an 'electron selective contact' or 'hole selective contact', depending on the polarity of the carriers it extracts.

To form a p-n junction in the bottom cell a diffused p-type carrier extracting layer 13 is formed onto the rear side of the substrate, so that the rear $AlO_x$ layer 9 of the rear passivating stack 5 is in direct contact with the diffused p-type carrier extracting layer 13. The rear passivating stack 5 is completed by the $SiN_x$ layer 10. Rear contacts 7 are deposited onto the most outer layer of the rear passivating stack 5, which can be the rear $AlO_x$ layer 9, preferably the $SiN_x$ layer 10. The sacrificial layer 6, or second $AlO_x$ layer is arranged on the carrier extracting layer 8 or the top layer of the layer stack 16, such as in the embodiments of FIG. 1, 3.

A thickness of the bottom cell without sacrificial layer (rear passivating stack, diffused p-type carrier extracting layer, substrate, dielectric layer, front carrier extracting layer) may be in the order of 100-200 microns.

The tandem solar cell device 1 comprises the bottom cell 2, without the sacrificial layer $AlO_x$ and covered at the front side by the top thin-film cell 11 and front contacts 12 as in the embodiment of FIG. 1, 3.

Figure 6:
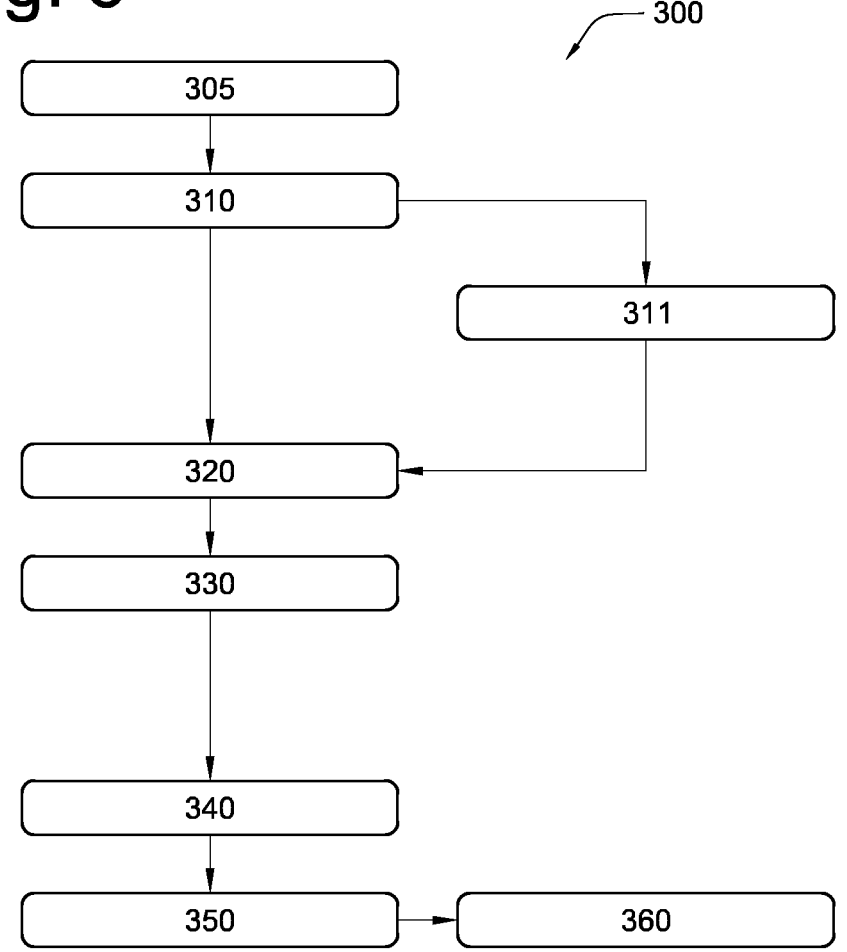
FIG. 6 shows a flowchart of a method of manufacturing of the tandem solar cell device with PERC bottom cell of FIG. 5 in accordance with the present invention.

FIG. 6 shows a flowchart 300 of a method of manufacturing of the bottom cell 2 and tandem solar cell 1 of FIG. 5 in accordance with an embodiment of the present invention.

In step 305, the diffused p-type carrier extracting layer 13 is formed onto the rear surface of the substrate 3. Formation will typically include diffusion of p-type dopants into the substrate surface from a gaseous ambient including BBr3. Alternatives are known in the art, such as deposition of dopant glass and anneal, implantation of dopants and anneal, or CVD. The resulting p-type diffusion layer has a front surface in contact with the substrate and an exposed rear surface. If necessary, the formation of the layer 13 can be followed by a removal of parasitic p-type doping from the front, e.g. by a single side etch.

Then subsequently in step 310, the front carrier extracting layer stack 16 is deposited onto the front surface of the substrate 3 by methods in accordance with steps 110 and 210 in the embodiments of FIGS. 2 and 4, where the deposition of the carrier extracting layer 8 is also preceded by the creation of the thin dielectric layer 4 onto the substrate 3. In other embodiments the carrier extracting layer is directly deposited into the substrate with no thin dielectric layer. The substrate may be cleaned prior to the deposition(s).

In step 311 an optional cleaning step of the rear surface of the substrate may be processed, e.g., as in steps 111 and 211 in the embodiments of FIGS. 2 and 4.

In step 320 both the rear $AlO_x$ layer 9 of the rear passivating stack 5 and the front $AlO_x$ sacrificial layer, or second $AlO_x$ layer 6 are deposited onto the rear surface of the diffused p-type carrier extracting layer and front surface of the front carrier extracting layer, respectively, by same methods as in steps 120 and 220 in the embodiments as described with reference to FIGS. 2 and 4.

In step 330 the rear $SiN_x$ layer 10 of the rear passivating coating 5 is deposited onto the rear $AlO_x$ layer 9 by same methods as in steps 130 and 230 in the embodiments as described with reference to FIGS. 2 and 4. In other embodiments step 330 may not be present.

In step 340 rear contacts 7 are deposited onto the rear surface of the passivating coating 5, preferably onto the $SiN_x$ layer.

In this embodiment the rear contacts typically consist of a Ag paste, screen printed, and subsequently fired-through with a spike anneal with a typical peak temperature between 700 and 1000° C. The temperature peak of the anneal may be limited in order to enhance the hydrogenation and avoid dehydrogenation of layer stack 16, e.g. to not more than 750° C.

Alternatively, contact openings can be provided in the rear coating, e.g., by laser ablation, and the rear contact can be deposited, e.g., by a PVD method or by screen printing, and e.g., consisting of aluminium with a small amount of silicon. Instead of a fire-through process, in that case an anneal, typically at much more moderate temperature than fire-through (a typical annealing temperature is in a range of 200-500° C., preferably between 200 and 450° C., more preferably between 200 and 400° C.), would be required for low-resistive contact formation and promote hydrogenation, such as in the previous embodiments.

In step 350 the sacrificial $AlO_x$ layer 6 is removed so as to leave an exposed surface of the carrier extracting layer or layer stack 16, preferably a bare surface void of $AlO_x$ traces, in accordance with steps 150 and 250 in the embodiments as described with reference to FIGS. 2 and 4.

In step 360 the top thin-film solar cell 11 is deposited onto the exposed and preferably bare carrier extracting layer 8;

Ag-based front contacts 12 are deposited onto the top cell to complete the device, in accordance with steps 160 and 260 in the embodiments as described with reference to FIGS. 2 and 4.

Figure 7:
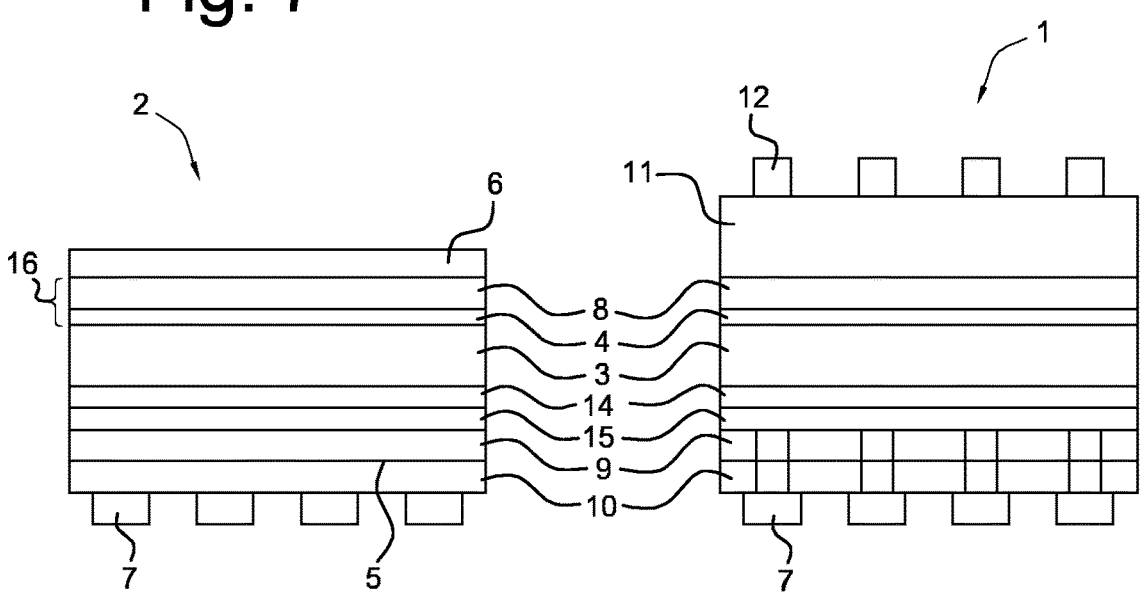
FIG. 7 shows a cross-sectional view of a PERC bottom cell and corresponding completed tandem solar cell device in accordance with the present invention.

FIG. 7 shows a cross-sectional view of a PERC bottom cell 2 according to an embodiment of the invention for completion into the tandem solar cell device 1. The bottom cell here also comprises the silicon based substrate 3, the carrier extracting layer 8, the rear passivating rear stack 5, the sacrificial layer 6, the rear contacts 7 and the thin dielectric layer 4, similarly to the embodiment of FIG. 1. In other embodiments the thin dielectric layer may be absent.

In this embodiment also typically, as in the embodiment of FIG. 5, the first conductivity type of the substrate 3 and of the carriers collected by the carrier extracting layer 8 can be identical and both n-type, but the substrate can alternatively be p-type and/or the conductivity type of carriers collected by carrier extracting layer 8 can be p-type.

The carrier extracting layer 8 is a polysilicon layer or variations such as described for the embodiments of FIGS. 1-6. The thin dielectric layer 4 is interposed between the substrate 3 and the carrier extracting layer 8. In some embodiments the thin dielectric layer 4 may be absent. Same or similar variations of the layer stack 16 as described for the embodiment as illustrated in FIG. 1 are possible here as well.

Further in this embodiment the bottom cell comprises a rear thin dielectric layer 14 at the rear side of and in direct contact with the substrate 3. The rear thin dielectric layer 14 may be selected from but is not limited to a group comprising a tunnel oxide layer, a layer comprising $SiO_xN_y$ (silicon-oxy-nitride), a layer comprising aluminium oxide $Al_2O_3$ and an intrinsic a-Si layer. The thin dielectric layer also acts as a buffer layer in that it passivates the rear substrate surface. As an effect, interface charge recombination may be reduced. The rear thin dielectric layer 14 is also in direct contact with a rear polysilicon carrier extracting layer 15 towards the rear side.

Further variations of the rear polysilicon carrier extracting layer 15 include, but are not limited to, polysilicon containing oxygen impurities and/or polysilicon containing carbon impurities as described above with reference to FIG. 1. Alternatively, the rear carrier extracting layer 15 can be a silicon-based layer being amorphous, partially crystalline or polycrystalline, mainly consisting of silicon. Such an amorphous layer can during a subsequent anneal later in the processing can be transformed into the rear partially crystalline or polycrystalline carrier extracting layer.

The rear polysilicon carrier extracting layer 15 is typically p-type doped and in direct contact with the rear $AlO_x$ layer 9 of the rear passivating stack 5.

The rear passivating stack 5 is completed by the $SiN_x$ layer 10. In some embodiments the $SiN_x$ layer will not be present. Rear contacts 7 are deposited onto the most outer layer of the rear passivating coating 5, which can be the rear $AlO_x$ layer 9, preferably the $SiN_x$ layer 10.

The sacrificial layer 6, or second $AlO_x$ layer is arranged on the carrier extracting layer 8, such as in the embodiments as described with reference to FIG. 1, 3, 5. A thickness of the bottom cell without sacrificial layer (rear passivating stack, rear carrier extracting layer, rear thin dielectric layer, substrate, thin dielectric layer, front carrier extracting layer) may be in the order of 100-200 microns.

The tandem solar cell device 1 comprises the bottom cell 2, without the sacrificial layer $AlO_x$ and covered at the front side by the top thin-film cell 11 and front contacts 12, such as in the embodiments as described with reference to FIGS. 1, 3 and 5.

Figure 8:
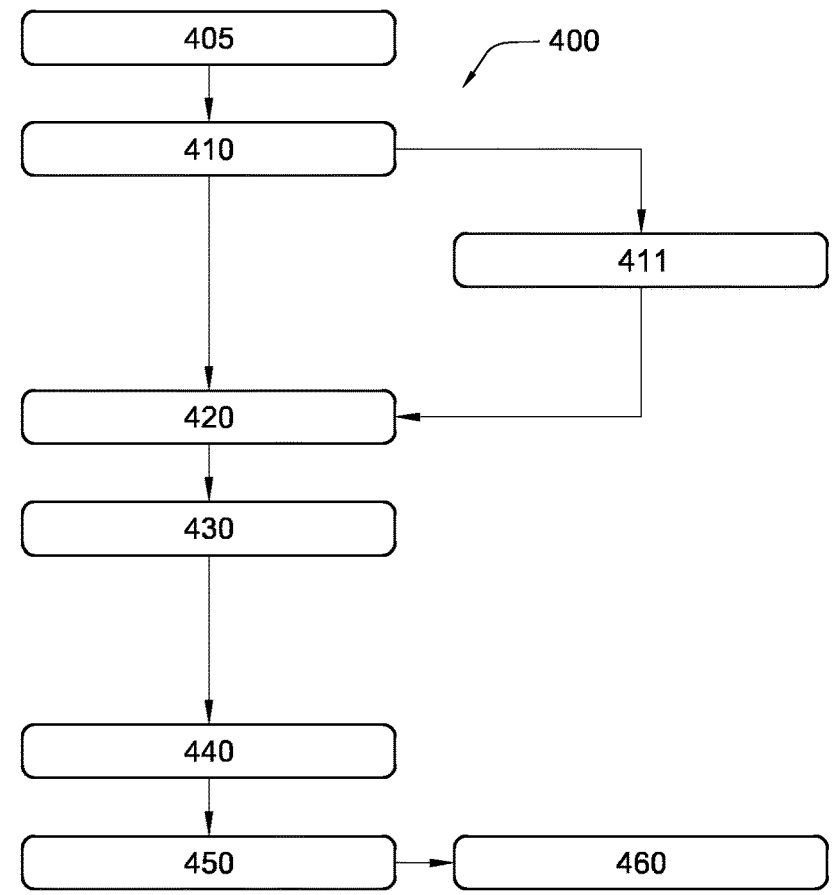
FIG. 8 shows a flowchart of a method of manufacturing of the tandem solar cell device with PERC bottom cell of FIG. 7 in accordance with the present invention.

FIG. 8 shows a flowchart 400 of a method of manufacturing of the bottom cell 2 and tandem solar cell 1 of FIG. 7 in accordance with an embodiment of the present invention.

In step 405, the rear polysilicon carrier extracting layer 15 is deposited onto the rear surface of the substrate. It may be preceded by deposition of the thin dielectric layer 14 onto the rear surface. If necessary, the formation of the layer 15 can be followed by a removal of parasitic deposition on the front, e.g. by a single side etch.

Then subsequently in step 410, the front carrier extracting layer stack 16 is deposited onto the front surface of the substrate 3, for example by a method in accordance with the embodiments as described with reference to FIGS. 2, 4 and 6 where deposition of the carrier extracting layer 8 is also preceded by the creation of the thin dielectric layer 4 onto the substrate, but another method to create the front carrier extracting layer stack may be used as well. In other embodiments the carrier extracting layer is directly deposited onto the substrate with no thin dielectric layer. The substrate may be cleaned prior to the deposition(s).

In step 411 optional cleaning of the rear surface of the substrate 3 from parasitic front carrier extracting layer stack deposition is performed, in accordance with optional steps 111, 211, 311 of the embodiments of FIGS. 2, 4 and 6.

In step 420 both the rear $AlO_x$ layer 9 of the passivating rear coating 5 and the front $AlO_x$ sacrificial layer, or second $AlO_x$ layer 6 are deposited onto the rear surface of the rear polysilicon carrier extracting layer 15 and onto the front surface of the front carrier extracting layer 8, respectively, by methods in accordance with steps 120, 220, 320 in the embodiments as described with reference to FIG. 2, 4, 6.

In step 430 the rear $SiN_x$ layer 10 of the rear passivating stack 5 is deposited onto the rear $AlO_x$ layer 9. In other embodiments step 430 may be omitted.

In step 440 rear contacts 7 are deposited onto the rear surface of the passivating coating 5, preferably onto the $SiN_x$ layer. In this embodiment the rear contacts typically consist of a Ag paste, screen printed, and subsequently fired-through with a spike anneal as explained above. Alternatively, contact openings can be provided in the rear coating, e.g., by laser ablation, and the rear contact can be deposited, e.g., by a PVD method or by screen printing, and e.g., consisting of aluminium with a small amount of silicon. Instead of a fire-through process, in that case an anneal, typically at much more moderate temperature than fire-through (typical temperature 200-500° C., more preferably between 200 and 450° C., most preferably between 200 and 400° C.), would be required for low-resistive contact formation and promote hydrogenation, such as in the previous embodiments. As a further alternative, metallization may be by aluminium using a higher anneal temperature (as described for FIG. 2), sufficient to form local aluminium-doped contacts, as described in WO2018026277, in which case the polysilicon layer 15 may be p-type doped or intrinsic.

In step 450 the sacrificial $AlO_x$ layer 6 is removed so as to leave an exposed surface of the carrier extracting layer 15, preferably a bare surface free of $AlO_x$ traces, by methods in accordance with steps 150, 250, 350 in embodiments as described with reference to FIGS. 2, 4 and 6.

In step 460 the top thin-film solar cell 11 is deposited onto the exposed and preferably bare carrier extracting layer 8 or layer stack 16; Ag-based front contacts 12 are deposited onto the top cell to complete the device, by methods in accordance with steps 160, 260, 360 in embodiments as described with reference to FIGS. 2, 4 and 6.

With reference to FIG. 7 it will be appreciated that a similar embodiment can be defined with a configuration to extract p-type carriers (holes) at the front side when the tandem cell design requires so (i.e., when the top cell has a bottom n-type contact) by modifying the embodiment of FIG. 7 so as to create the p-type carrier extracting layer (hole extracting layer) on the front of the bottom cell instead of on the rear of the bottom cell, and create the n-type carrier extracting layer (electron extracting layer) on the rear of the bottom cell instead of the front of the bottom cell.

Also, in the embodiments of FIG. 7 the n-type substrate could be interchanged as well to a p-type substrate while still having n-type carrier extraction at the front surface, and p-type carrier extraction at the rear surface.

It will be appreciated that in some embodiments the creation of electrical contacts on the rear surface can be carried out by a deposition of a contact pattern at an earlier stage than the creation of the sacrificial $AlO_x$ layer, while the annealing of the contact pattern to form the electrical contacts is carried out after the removal of the sacrificial layer.

In the foregoing description of the figures, the invention has been described with reference to specific embodiments thereof. It will, however, be evident that various modifications and changes may be made thereto without departing from the scope of the invention as summarized in the attached claims.

In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the appended claims.

The invention claimed is:

1. A method for manufacturing a two terminal or three terminal tandem solar cell comprising a silicon-based bottom solar cell and a thin-film top solar cell; the top solar cell being arranged on a front surface of the bottom solar cell; the method comprising:

providing a silicon substrate with a front surface and a rear surface, the substrate having a first conductivity type, and carrying out a sequence of steps comprising at least:

creating on the front surface of the silicon substrate a carrier extracting layer stack, the carrier extracting layer stack comprising at least a carrier extracting layer formed on or in the front surface of the substrate, creating on the rear surface of the silicon substrate a passivating coating layer comprising at least a deposition of a first $AlO_x$ layer, wherein the method further comprises:

creating a sacrificial layer stack comprising at least a second $AlO_x$ layer on the carrier extracting layer stack on the front surface of the silicon substrate;

removing the sacrificial layer stack from the carrier extracting layer stack on the front surface and thus exposing the surface of the carrier extracting layer stack free from $AlO_x$, and creating one or more layers of the thin film top solar cell on the exposed carrier extracting layer stack.

2. The method according to claim 1, further comprising: forming a layer for creating metal-based electrical contacts on the rear surface, including an annealing step to create the electrical contacts, which forming step is conducted after creating and before removing the sacrificial layer stack; and wherein after removing the sacrificial layer stack, the thin-film solar cell is created onto the carrier extracting layer stack.

3. The method according to claim 1, further comprising: creating on the rear surface a contact pattern, and after at least the step of removing the sacrificial layer performing an annealing step for creating electrical contacts from the contact pattern.

4. The method according to claim 1, wherein the carrier extracting layer stack further comprises at least one additional layer created on top of the carrier extracting layer before said creating the sacrificial layer stack comprising at least the second $AlO_x$ layer on the carrier extracting layer stack on the front surface of the silicon substrate, such that the carrier extracting layer is between the front surface of the substrate and a surface of the at least one additional layer.

5. The method according to claim 4, wherein the at least one additional layer is a layer having first conductivity type.

6. The method according to claim 1, wherein the sacrificial layer stack comprising at least the second $AlO_x$ layer is removed from the carrier extracting layer stack on the front surface by means of a single-sided etching process.

7. The method according to claim 1, wherein the passivating coating layer on the rear surface comprises a stack of the first $AlO_x$ layer and a silicon nitride layer, in which the first $AlO_x$ layer is arranged between the silicon substrate and the silicon nitride layer, and the creation of the rear passivating coating layer comprises a single-sided deposition of the at least one silicon nitride layer.

8. The method according to claim 1, wherein the creation of the carrier extracting layer stack is preceded by a deposition or formation of a thin dielectric layer on the front surface, in which the thin dielectric layer is arranged in between the front surface of the silicon substrate and a surface of the carrier extracting layer stack.

9. The method according to claim 1, wherein either the carrier extracting layer stack extracts n-type carriers and comprises a material selected from a group comprising poly-silicon, aluminium-doped zinc-oxide, poly-silicon containing carbon impurities, poly-silicon containing oxygen impurities, titanium oxide, the selected material optionally comprising a n-type dopant; or the carrier extracting layer stack extracts p-type carriers and comprises a material selected from a group comprising poly-silicon, poly-silicon containing carbon impurities, poly-silicon containing oxygen impurities, molybdenum oxide, tungsten oxide, nickel oxide, the selected material optionally comprising a p-type dopant.

10. The method according to claim 1, wherein the carrier extracting layer stack comprises a silicon-based layer being amorphous, partially crystalline or polycrystalline, mainly consisting of silicon.

11. The method according to claim 4, wherein at least one additional layer comprises a silicon-based layer being amorphous, partially crystalline or polycrystalline, mainly consisting of silicon.

12. The method according to claim 1, wherein the carrier extracting layer stack comprises a poly-silicon layer comprising a p-n junction arranged inside the poly-silicon layer.

13. The method according to claim 1, further comprising that preceding the creation on the rear surface of the passivating coating layer, a stack of a second thin dielectric layer and a poly-silicon passivated contact layer is formed, wherein the poly-silicon passivated contact layer is arranged between a surface of the thin dielectric layer and a surface of the passivating coating layer on the rear surface of the silicon substrate.

14. The method according to claim 1, wherein the second $AlO_x$ layer is coated with either a silicon dioxide layer or a silicon-oxy-nitride layer, or a combination thereof.

15. The method according to claim 1, wherein the thin film top solar cell is selected from a group comprising a perovskite(s) based thin solar cell, a copper indium gallium diselenide based solar cell, a copper zinc tin sulfide based solar cell, an amorphous silicon based solar cell and a cadmium telluride based solar cell.

16. The method according to claim 1, wherein the step of creating metal-based or metal-alloy based electrical contacts on the rear surface comprises creating aluminum doped areas; in which the annealing step is performed at a temperature above 577° C. up to about 800° C.

* * * * *